United States Patent
Hong et al.

(10) Patent No.: US 12,326,475 B2
(45) Date of Patent: Jun. 10, 2025

(54) BATTERY ELECTRIC FLOW TEST SYSTEM AND METHOD

(71) Applicant: MINTECH CO., LTD, Daejeon (KR)

(72) Inventors: Young Jin Hong, Daejeon (KR); Hee Kyung Myung, Daejeon (KR); Jae Hoon Lee, Gyeonggi-do (KR); Seong Joon Hong, Daejeon (KR); In Jae Hwang, Daejeon (KR)

(73) Assignee: Mintech Co., Ltd, Daejeon (KR)

( * ) Notice: Subject to any disclaimer, the term of this patent is extended or adjusted under 35 U.S.C. 154(b) by 464 days.

(21) Appl. No.: 17/435,034

(22) PCT Filed: Apr. 12, 2021

(86) PCT No.: PCT/KR2021/004588
§ 371 (c)(1),
(2) Date: Aug. 30, 2021

(87) PCT Pub. No.: WO2021/221350
PCT Pub. Date: Nov. 4, 2021

(65) Prior Publication Data
US 2022/0326310 A1    Oct. 13, 2022

(30) Foreign Application Priority Data

Apr. 28, 2020  (KR) .......................... 10-2020-0051636
Mar. 12, 2021  (KR) .......................... 10-2021-0032828

(51) Int. Cl.
*G01R 31/3835*   (2019.01)
*G01R 31/12*     (2020.01)
(Continued)

(52) U.S. Cl.
CPC ......... *G01R 31/3835* (2019.01); *G01R 31/12* (2013.01); *H01M 10/4285* (2013.01); *H01M 10/48* (2013.01); *H01M 10/54* (2013.01)

(58) Field of Classification Search
CPC .............. G01R 31/3842; G01R 31/3835; G01R 31/12; G01R 31/385; G01R 31/389;
(Continued)

(56) References Cited

U.S. PATENT DOCUMENTS 3,872,457 A      3/1975  Ray
9,207,285 B1 *  12/2015  Swanton ............. G01R 31/374
(Continued)

FOREIGN PATENT DOCUMENTS

JP      04198783        7/1992
JP      2017106889 A    6/2017
(Continued)

OTHER PUBLICATIONS

Extended European Search Report for PCT/KR2021/004588 completed Apr. 21, 2022 (9 pages).
(Continued)

*Primary Examiner* — Yoshihisa Ishizuka
*Assistant Examiner* — Carter W Ferrell
(74) *Attorney, Agent, or Firm* — Young Basile Hanlon & MacFarlane, P.C.

(57) ABSTRACT

A system of testing electricity flow of a battery manages registration, modification, deletion, and display of a set value, a measured value, and a diagnostic value for each test item for the battery and matches the set value for each test item registered by the test item manager with a type of the battery and stores the set value. The system also identifies a phase difference between an input frequency input to the battery and an output frequency corresponding to the input frequency to determine a high-frequency resonant frequency and then calculates an AC impedance corresponding to the determined high-frequency resonant frequency and compares the calculated AC impedance with an electricity flow upper limit to diagnose that the electricity flow is normal when the calculated AC impedance is lower than the electricity flow upper limit and diagnose that the electricity flow is abnormal when the calculated AC impedance is higher.

7 Claims, 9 Drawing Sheets

(51) Int. Cl.
*H01M 10/42* (2006.01)
*H01M 10/48* (2006.01)
*H01M 10/54* (2006.01)

(58) Field of Classification Search
CPC .. H01M 10/4285; H01M 10/48; H01M 10/54; Y02W 30/84
See application file for complete search history.

(56) References Cited

U.S. PATENT DOCUMENTS

| | | | | |
|---|---|---|---|---|
| 2007/0090843 | A1* | 4/2007 | De Doncker | G01R 31/389 324/426 |
| 2008/0048622 | A1* | 2/2008 | Fee | H01M 10/44 320/141 |
| 2011/0191043 | A1* | 8/2011 | Lee | G01R 31/1263 702/65 |
| 2012/0099618 | A1 | 4/2012 | Nishi | |
| 2013/0162258 | A1 | 6/2013 | Patin | |
| 2020/0158784 | A1* | 5/2020 | Fabregas | B60L 3/04 |

FOREIGN PATENT DOCUMENTS

| | | | |
|---|---|---|---|
| JP | 2019508697 A | 3/2019 | |
| KR | 102029776 B1 | 10/2019 | |
| WO | WO-2019209033 A1 * | 10/2019 | ............ B60L 3/0046 |

OTHER PUBLICATIONS

Adrian Calborean, Resonance Frequency Analysis of Lead-Acid Cells: An EIS Approach to Predict the State-of-Health, Journal of Energy Storage, Dec. 19, 2010, (6 pages), vol. 27, Elsevier Ltd.
International Search for PCT/KR2021/004588 completed Jul. 16, 2021 (3 pages).

* cited by examiner

BATTERY ELECTRIC FLOW TEST SYSTEM AND METHOD

CROSS-REFERENCE TO RELATED APPLICATIONS

The present application is a national stage application, which claims benefit under 35 U.S.C. § 365 of International Application No. PCT/KR2021/004588, entitled "BATTERY ELECTRIC FLOW TEST SYSTEM AND METHOD" and filed Apr. 12, 2021, which is hereby incorporated by reference in its entirety and which claims benefit from Korean Patent Application Serial No. 10-2021-0032828, filed Mar. 12, 2021, and from Korean Patent Application Serial No. 10-2020-0051636, filed Apr. 28, 2020.

TECHNICAL FIELD

The present disclosure relates to a technic of testing electricity flow for a used battery (e.g., waste battery, etc.), and more particularly, to a system of testing electricity flow of a used battery to check a state of charge and chargeability of a used battery before reusing or recycling and check whether there is any abnormality in electricity flow through an electrical resistance test and to a method of the same.

Discussion of Related Art

According to the [Specific Observances for Those Recycling Wastes] in accordance with Article 13-2, Paragraph 3 of the [Waste Management Act] and Article 13-2, Paragraph 3 of the Enforcement Rule thereof, and Attached Table 5-4, No. 3 of the Enforcement Rule thereof, a person who intends to recycle waste batteries shall perform an appearance test and an electricity flow test of a used battery of electrical vehicles before recycling.

In the published content, the electricity flow test of the used battery is to check the current state of charge and chargeability, and to check whether there is any abnormality in the electricity flow through an electrical resistance test through connection to a charging equipment.

However, there is no system or device for checking the electricity flow of waste batteries through connection of a charging equipment so far.

DETAILED DESCRIPTION OF THE INVENTION

Technical Objects

Embodiments of the present disclosure are directed to a system and a method of testing electricity flow of a battery, the system and the method being capable of performing electricity flow tests of a used battery.

Embodiments of the present disclosure are directed to a system and a method of testing electricity flow of a battery, the system and the method being capable of performing electricity flow tests of a used battery for an electric vehicle.

In addition to the above problems, embodiment according to the present disclosure may be used to achieve other problems not specifically mentioned herein.

Technical Solution to the Problem

According to an embodiment of the present disclosure, a system of testing electricity flow of a battery, the battery including a used battery, the system including: a test item manager operating in response to an output of a user input unit and configured to manage registration, modification, deletion, and display of a set value, a measured value, and a diagnostic value for each test item for the battery; a set value storage configured to match the set value for each test item registered by the test item manager with a type of the battery and store the set value; an AC impedance meter configured to vary an input frequency, sequentially input the varied input frequency to the battery, and output an output frequency for each input frequency; an impedance identifier configured to operate the AC impedance meter according to an instruction of the test item manager, identify a phase difference between the input frequency input to the battery and an output frequency corresponding to the input frequency to determine a high-frequency resonant frequency, and calculating an AC impedance corresponding to the determined high-frequency resonant frequency; and an impedance diagnoser configured to compare the AC impedance calculated by the impedance identifier with an electricity flow upper limit and diagnose that it is normal when the calculated AC impedance is lower than the electricity flow upper limit and diagnose that it is abnormal when the calculated AC impedance is higher than the electricity flow upper limit.

In some embodiments, the system of testing electricity flow of a battery further includes: a battery voltage identifier configured to operate a battery voltage meter electrically connected thereto according to an instruction of the test item manager, and identify a voltage of the battery through the battery voltage meter; a voltage diagnoser configured to compare the voltage of the battery identified by the battery voltage identifier with a set voltage range and diagnose that it is normal when the identified battery voltage is within the set voltage range and otherwise, diagnose that it is abnormal; an insulation resistance identifier configured to operate an insulation resistance meter electrically connected thereto according to an instruction of the test item manager, and identify an insulation resistance of the battery through the insulation resistance meter; an insulation resistance diagnoser configured to compare the insulation resistance identified by the insulation resistance identifier with a set insulation resistance lower limit and diagnose that it is abnormal when the identified insulation resistance is lower than the set insulation resistance lower limit and diagnose that it is normal when the identified insulation resistance is higher than the set insulation resistance lower limit; and a conformance diagnoser configured to receive each diagnosis result output from the voltage diagnoser, the insulation resistance diagnoser, and the impedance diagnoser to determine a final conformance result.

In some embodiments, the test item manager provides an item setting screen to a user through a display device, the item setting screen including a field in which a battery type, the set voltage range according to the battery type, the insulation resistance lower limit, and the electricity flow upper limit may be input by a user or displayed, a field for displaying the battery voltage, the insulation resistance and the AC impedance identified by each of the identifiers, a field for displaying a state of charge, an electricity flow, and an insulation safety according to the diagnosis result of each of the diagnosers, and a field for displaying the final conformance result diagnosed by the conformance diagnoser.

According to an embodiment of the present disclosure, a method of testing electricity flow of a battery, the battery including a used battery includes: setting a type of the battery to be tested and a set value for each test item; operating an AC impedance meter according to a user's request, inputting a first input frequency to the battery, and identifying a first output frequency for the first input frequency; identifying a first phase difference between the first input frequency and the first output frequency; determining a resonant frequency by identifying whether the first phase difference is '0'; inputting a second input frequency to the battery by varying frequency and identifying a second output frequency for the second input frequency; sequentially varying the frequency up to a set frequency to input the varied frequency to the battery, identifying a phase difference between the input frequency input to the battery and the output frequency corresponding to the input frequency to determine a resonant frequency, and registering the resonant frequency; determining a frequency having a highest band from among the registered resonant frequencies as a high-frequency resonant frequency; calculating an AC impedance using a voltage and a current at the high-frequency resonant frequency; and comparing the calculated AC impedance with an electricity flow upper limit of the set value to diagnose that it is normal when the calculated AC impedance is lower than the electricity flow upper limit and diagnose that it is abnormal when the calculated AC impedance is higher than the electricity flow upper limit.

Effects of the Invention

According to one or more embodiments of the present disclosure, it is possible to perform electricity flow tests of a waste battery of an electric vehicle in accordance with the ordinance of the Ministry of Environment.

According to one or more embodiments of the present disclosure, a system and a method are capable of performing electricity flow tests of a waste battery for an electric vehicle at a low cost by using an AC power.

In addition to the above objects, embodiment according to the present disclosure may be used to achieve other objects not specifically mentioned herein.

DETAILED DESCRIPTION

Hereinbelow, some embodiments will be described clearly and in detail with reference to the accompanying drawings so that those of ordinary skill in the art to which the present disclosure pertains (hereinafter, those skilled in the art) may easily practice the present disclosure. As used herein, the term "unit" in the specification may mean a hardware component or circuit.

Hereinafter, a system and a method of testing electricity flow of battery according to an embodiment of the present disclosure will be described with reference to the accompanying drawings.

Prior to description, a battery used hereinbelow may mean a used battery (e.g., a waste battery, etc.) used in an electric vehicle, and a battery to be tested may be one of a battery cell, a battery module, or a battery pack.

Figure 1:
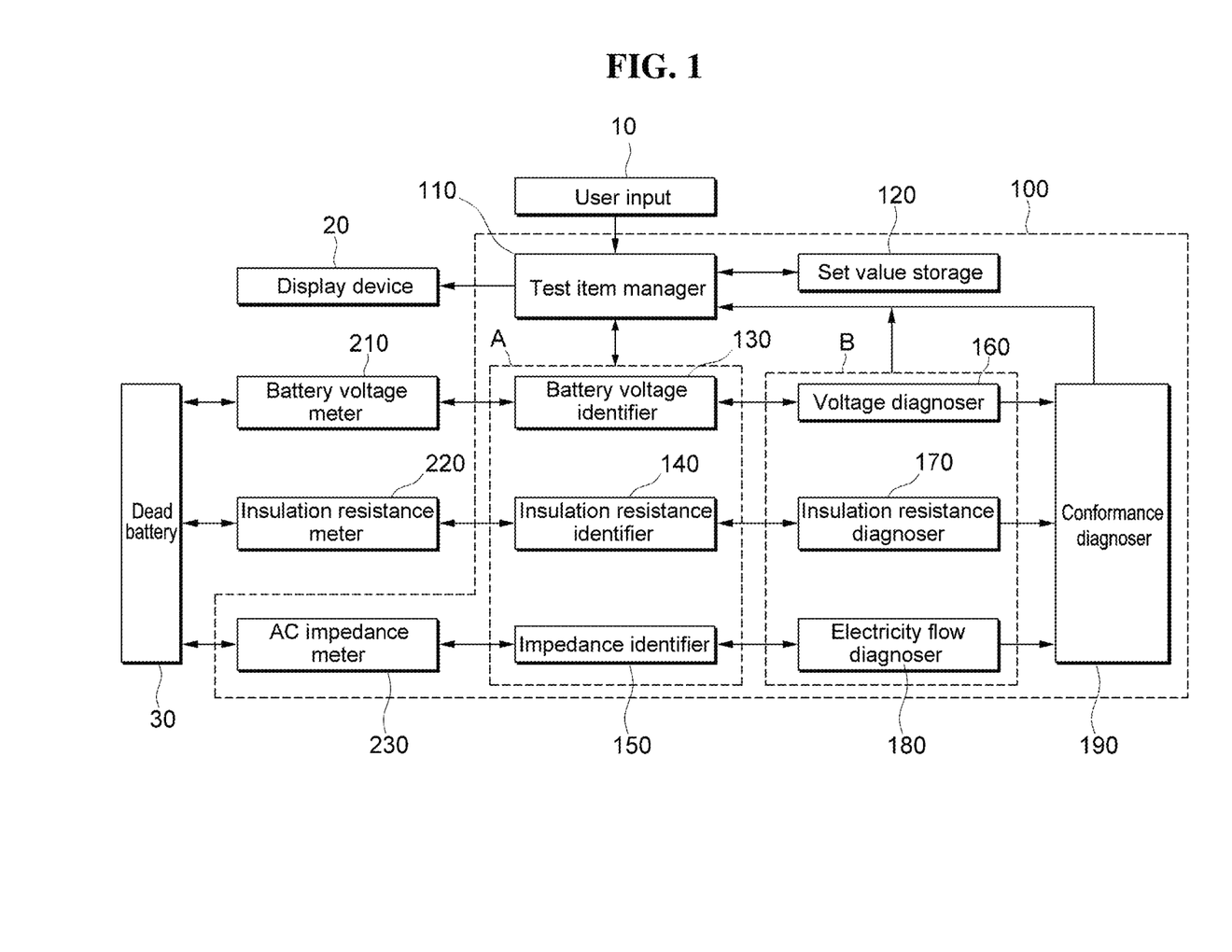
FIG. 1 is a block diagram illustrating a system of testing electricity flow of a battery according to an embodiment of the present disclosure.

FIG. 1 is a block diagram illustrating a system of testing electricity flow of a battery according to an embodiment of the present disclosure. Referring to FIG. 1, a system 100 of testing electricity flow of a battery according to an embodiment of the present disclosure includes a test item manager 110, a set value storage 120, a battery voltage identifier 130, an insulation resistance identifier 140, an impedance identifier 150, a voltage diagnoser (e.g., diagnose unit) 160, an insulation resistance diagnoser 170, an electricity flow diagnoser 180, a conformance diagnoser 190, and an AC impedance meter 230.

Herein, when the AC impedance meter 230 is manufactured in a form detachable from the system 100 of the present disclosure, the system 100 according to an embodiment of the present disclosure may omit the AC impedance meter 230.

In an embodiment, when the system of testing electricity flow of a battery according to an embodiment of the present disclosure uses only the AC impedance meter 230, the battery voltage identifier 130, the insulation resistance identifier 140, the voltage diagnoser 160, and the insulation resistance diagnoser 170 may be omitted.

The test item manager 110 manages a set value, a measured value, a diagnostic value, and a final test value for each battery test item. The set value means a reference value for each test item for comparison with a measured value, and the measured value means a value measured for each test item, for example, a measured battery voltage, a measured battery insulation resistance, and a measured battery impedance. In addition, a diagnostic value is a result of comparison between the reference value and the measured value for each test item, and means pass (e.g., normal) or fail (e.g., abnormal). In addition, a final test value is a value indicating final conformance of the battery according to the diagnostic value, and means, for example, that it conforms (e.g., suitable, proper, appropriate, etc.) or non-conforms (e.g., unsuitable, non-proper, inappropriate, etc.).

In addition, the test item manager 110 registers a set value, which is a reference value for each test item, for each battery type according to a user's request input through a user input unit 10, and performs management such as modification (e.g., correction) or deletion of the set value. The test item manager 110 generates an item setting screen to be displayed externally through a display device 20, and the user may input and register a new battery type and set values for a new battery type through the item setting screen, and check the set values for each test item, various diagnostic values, and final test values for the battery to be tested through the item setting screen.

Figure 6:
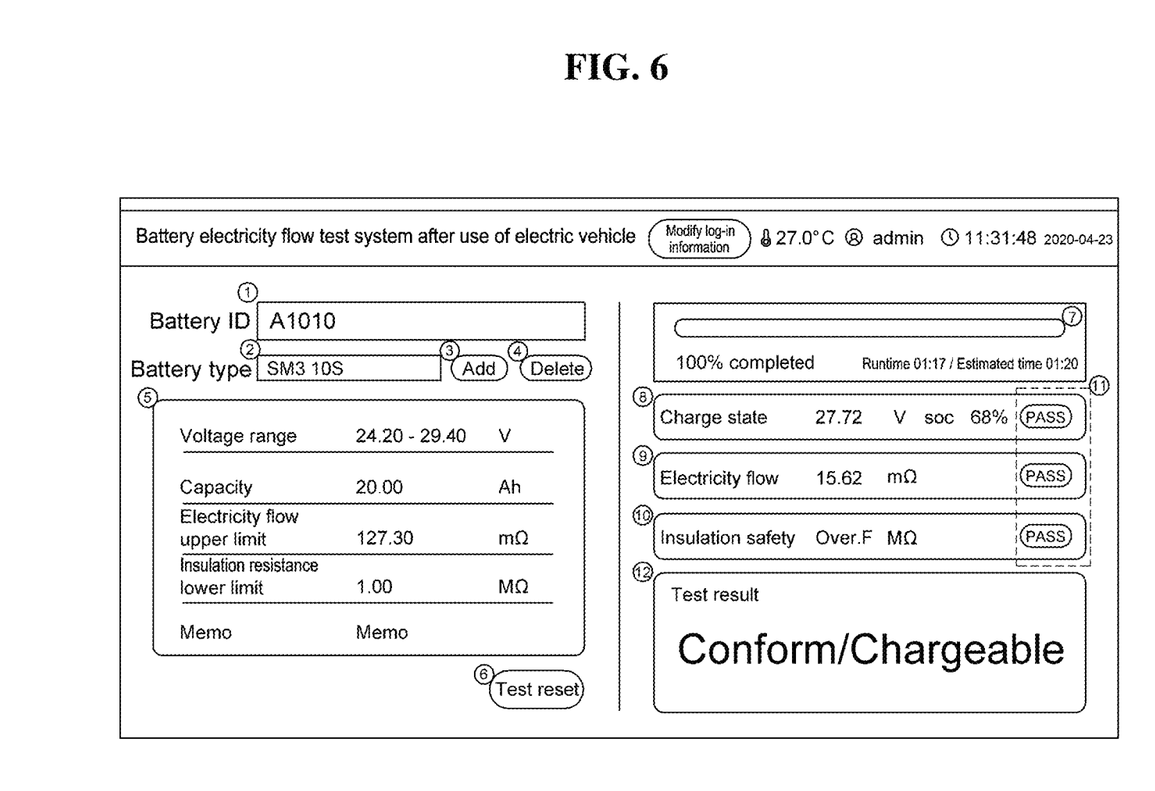
FIGS. 6 and 7 are diagrams illustrating a screen for displaying test items and test results in the system of testing electricity flow of a battery according to an embodiment of the present disclosure.
Figure 7:
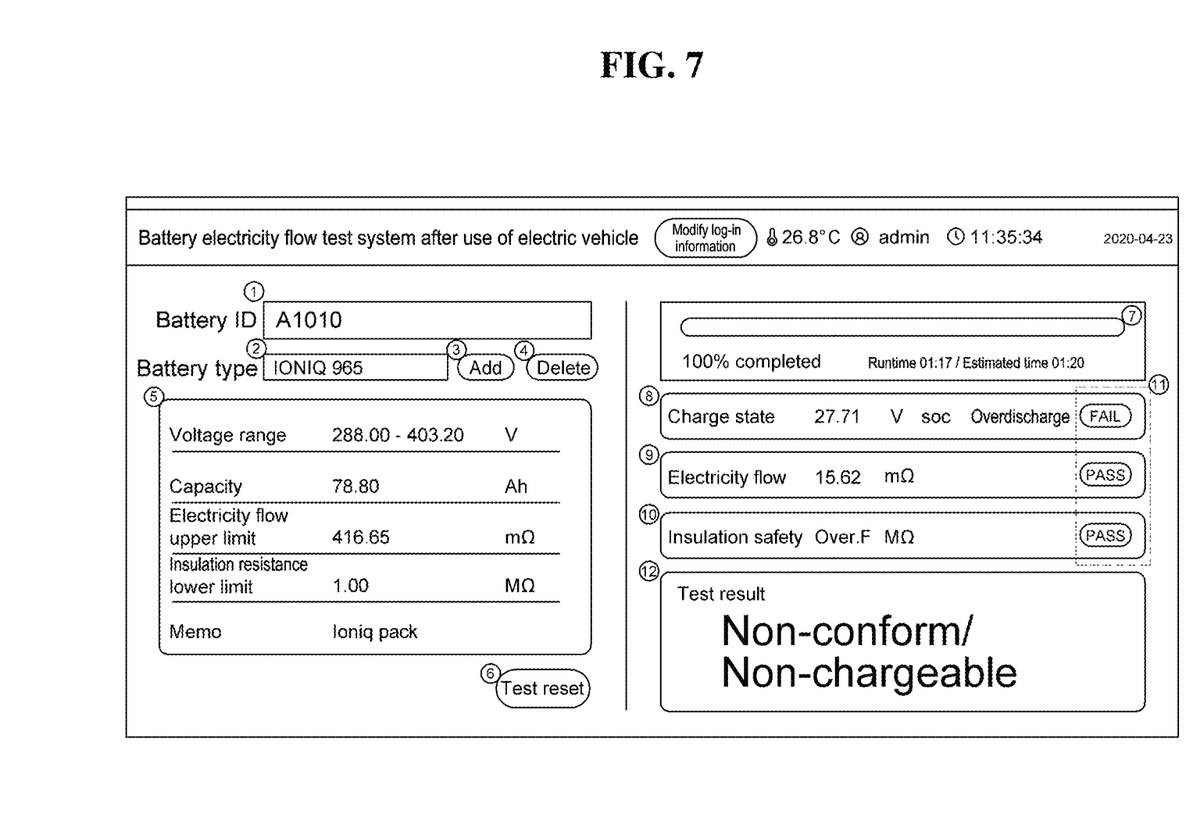

Herein, the item setting screen will be described with reference to FIGS. 6 and 7. FIGS. 6 and 7 are diagrams illustrating a screen for displaying test items and test results in the system of testing electricity flow of a battery according to an embodiment of the present disclosure. Referring to FIGS. 6 and 7, on the left side of the item setting screen, there displayed a field (①) in which a battery ID (identification information) may be input by a user or a registered battery ID may be called to be displayed, a field (②) in which a battery type may be input by a user or a registered battery type may be called to be displayed, a button (③) to call a new item setting screen for recording information of a new battery, a button (④) to delete the currently displayed battery information, a field (⑤) in which a set value for test items may be input by a user or a registered set value may be called to be displayed, and a button (⑥) to instruct the start of the test. The button (⑥) to instruct the start of the test is changed to "test reset" and displayed when the user clicks the button.

In the field (⑤), there are a field, indicated as "voltage range", displaying upper and lower limits of a battery voltage for the corresponding battery type, a field, indicated as "capacity", displaying a reference current value, a field, indicated as "electricity flow upper limit", displaying an upper limit of an AC impedance, and a field, indicated as "insulation resistance lower limit", displaying a lower limit of an insulation resistance.

In addition, on the right side of the item setting screen, there is a field for displaying the measurement value and measurement result for the test item.

For example, referring to FIGS. 6 and 7, on the right side of the item setting screen, there displayed a field (⑦) in which a test progress level (e.g., runtime) is displayed, a field (⑧), indicated as "state of charge", displaying a measured battery voltage and a state of charge (SOC), a field (⑨), indicated as "electricity flow", displaying a measured AC impedance, a field (⑩), indicated as "insulation safety", displaying a measured insulation resistance, a field (⑪) displaying a diagnosis result according to each measurement value and a field (⑫) displaying the final result of the electricity flow test.

The SOC is calculated using the battery voltage or is identified using an SOC table generated based on maximum and minimum voltages of the battery.

In FIG. 6, referring to the measurement results on the right side of the item setting screen, the measured battery voltage is 27.72 V, which falls within the set voltage range of 24.20 V to 29.40 V, and thus is displayed as pass, the AC impedance, that is, electricity flow, is 15.62Ω, which is equal or less than the set value of 20.00Ω, and thus is displayed as pass, and the measured insulation resistance exceeds the set value of 1.00 MΩ, and thus is displayed as pass. Accordingly, since all test items passed, the final test result is indicated as "conform/chargeable".

On another hand, in FIG. 7, referring to the measurement result on the right side of the item setting screen, the measured battery voltage is 27.71 V, which is out of the set voltage range of 288.00 V to 403.20 V, and thus is displayed as fail, the AC impedance, that is, electricity flow, is 15.62Ω, which is equal or less than the set value of 416.65Ω, and thus is displayed as pass, and the measured insulation resistance exceeds the set value of 1.00 MΩ, and thus is displayed as pass. Accordingly, since there was an abnormality in one of all test items, the final test result is indicated as "non-conform/non-chargeable".

The set value storage 120 matches the set value for each test item registered by the test item manager 110 with the corresponding battery type and stores it. It is obvious that the set value storage 120 may store the test result of the tested used battery.

The system 100 of testing electricity flow of a battery according to an embodiment of the present disclosure has a measurement value identifier A for identifying a measurement value for each test item. Each identifier of the measurement value identifier A operates according to an instruction of the test item manager 110, and provides the identified measurement value to the test item manager 110. The measurement value identifier A includes a battery voltage identifier 130, an insulation resistance identifier 140, and an impedance identifier 150.

The battery voltage identifier 130 controls operation of the battery voltage meter 210 to receive a measurement result measured by the battery voltage meter 210 and identify a battery voltage (e.g., a voltage of a battery cell or a battery module or a battery pack). Herein, the battery voltage meter 210 is a device for measuring a voltage of the battery by having one measuring terminal connected to a negative electrode of the battery and another measuring terminal connected to a positive electrode of the battery, and is a common battery voltage meter.

The insulation resistance identifier 140 controls the operation of the battery voltage meter 210 to receive and identify an insulation resistance of the battery measured by the insulation resistance meter 220. Herein, the insulation resistance meter 220 is a device for measuring the insulation resistance of a common battery, for example, a device having one terminal connected to one of the positive or negative terminal of the battery and another terminal connected to a body of the battery to measure the insulation resistance of the battery.

The impedance identifier 150 controls operation of the AC impedance meter 230 to receive a frequency of a plurality of currents supplied from the AC impedance meter 230 and a frequency of a voltage measured corresponding to the frequency of the supplied current, to identify a phase difference between the frequencies with respect to a current and a voltage of the same frequency, and then to identify an AC impedance by using a voltage and a current of a frequency that has no phase difference. Herein, the AC impedance represents the same value as a DC impedance with respect to a DC power by using the voltage and the current of a frequency having no phase difference.

The system 100 of testing electricity flow of a battery according to an embodiment of the present disclosure includes a measurement value diagnoser B for diagnosing whether a measurement value for each test item passes or fails (e.g., normal or abnormal). Each diagnoser of the measurement value diagnoser B provides a diagnosis result to the test item manager 110. The measurement value diagnoser B includes a voltage diagnoser 160, an insulation resistance diagnoser 170, and an electricity flow diagnoser 180.

The voltage diagnoser 160 compares the voltage detected by the battery voltage identifier 130 with a set voltage, that is, a set voltage range, and diagnoses whether the detected voltage is within the set voltage range. The voltage diagnoser 160 diagnoses that it is normal (e.g., pass) when the detected voltage is within the set voltage range, and otherwise, diagnoses that it is abnormal (e.g., fail).

The insulation resistance diagnoser 170 compares the insulation resistance identified by the insulation resistance identifier 140 with the set insulation resistance, and when the identified insulation resistance is higher than the set insulation resistance, it is diagnosed as normal, and otherwise, it is diagnosed as abnormal.

The electricity flow diagnoser 180 compares the AC impedance identified by the impedance identifier 150 with the set impedance, and when the determined AC impedance is lower than the set insulation resistance, it is diagnosed as normal, and otherwise, it is diagnosed as abnormal.

The conformance diagnoser 190 receives each diagnosis result output from the voltage diagnoser 160, the insulation resistance diagnoser 170, and the electricity flow diagnoser 180, determines a final conformance result, and provides the final conformance result to the test item manager 110.

The AC impedance meter 230 sequentially generates frequencies in a set frequency band in the order from the minimum frequency to the maximum frequency or from the maximum frequency to the minimum frequency, inputs them to the used battery 30, and provides an output frequency corresponding to the input frequency to the impedance identifier 150.

Figure 2:
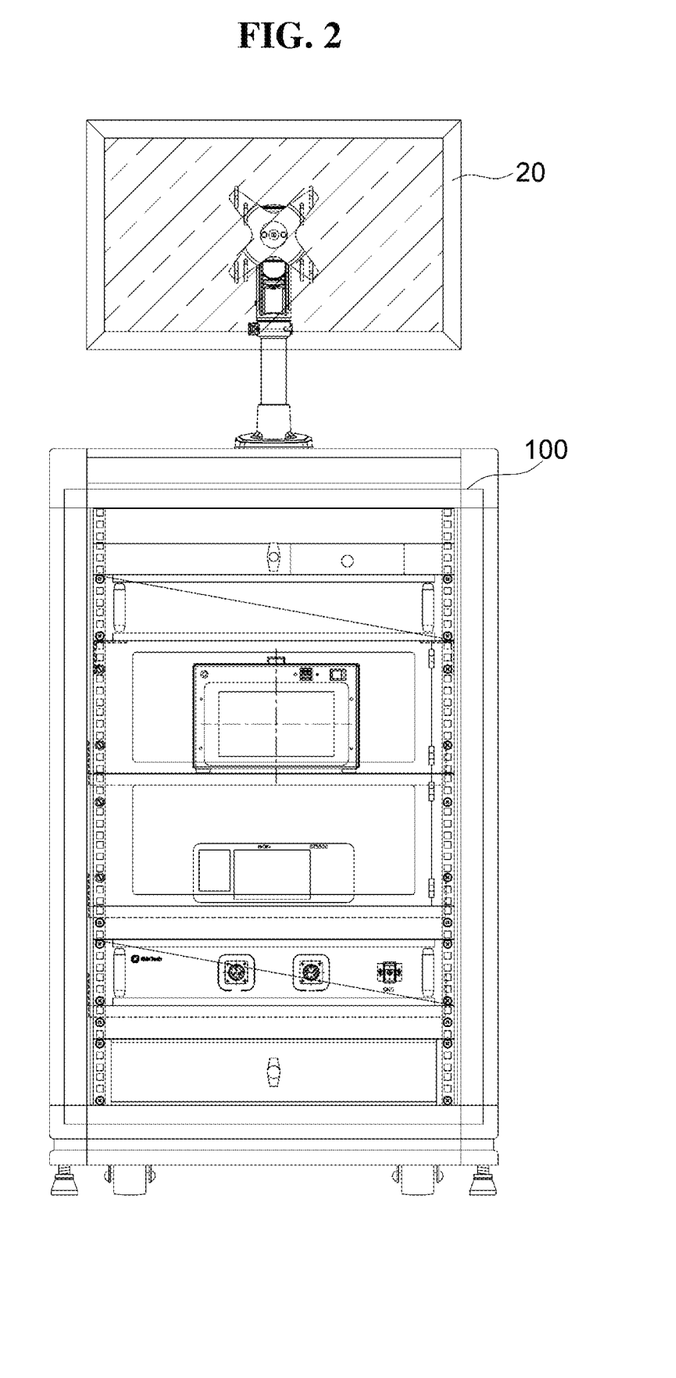
FIG. 2 is a perspective view illustrating a system of testing electricity flow of a battery according to an embodiment of the present disclosure.

The system 100 of testing electricity flow of a battery according to an embodiment of the present disclosure configured as described above is manufactured as illustrated in FIG. 2 as an example. FIG. 2 is a perspective view illustrating a system of testing electricity flow of a battery according to an embodiment of the present disclosure. Referring to FIG. 2, the display device 20 is configured as a common monitor, and in the system 100 of testing electricity flow of a battery, a connection member of a plug or a socket to be electrically connected to terminals of each meter (e.g., measurement apparatus) 210, 220, 230 is provided. It is obvious that when the AC impedance meter 230 is configured, the system 100 of testing electricity flow of a battery will be configured unitarily (e.g., in a monolithic manner) with the AC impedance meter 230.

Figure 3:
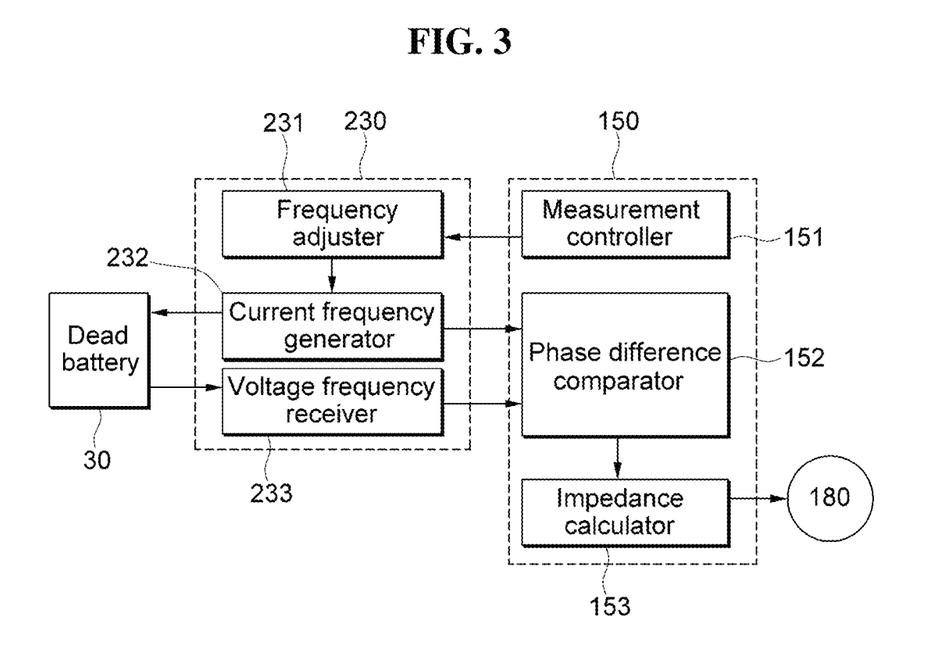
FIG. 3 is a diagram illustrating in detail an impedance measurement configuration in a system of testing electricity flow of a battery according to an embodiment of the present disclosure.
Figure 4:
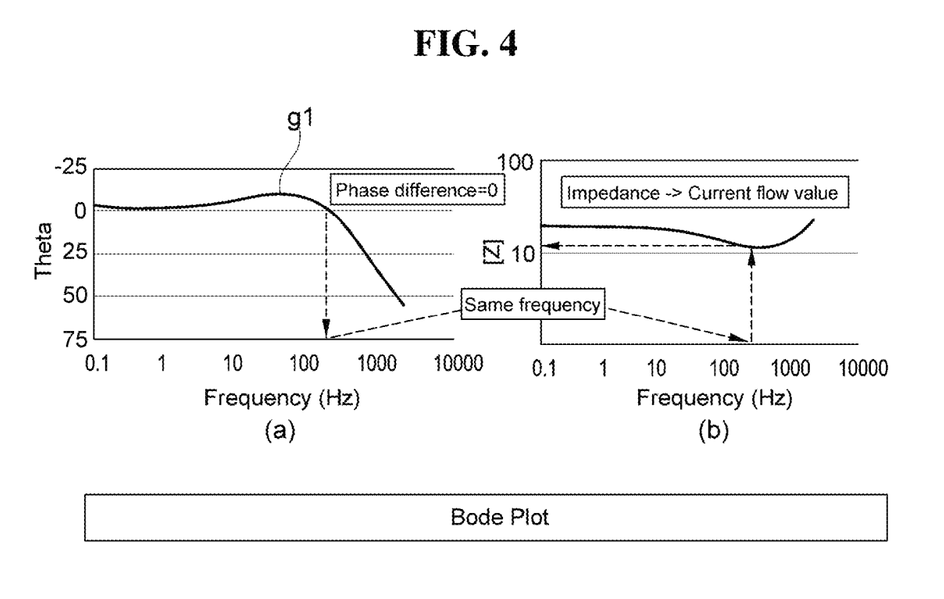
FIGS. 4 and 5 are diagrams for explaining an impedance measuring operation in a system of testing electricity flow of a battery according to an embodiment of the present disclosure.
Figure 5:
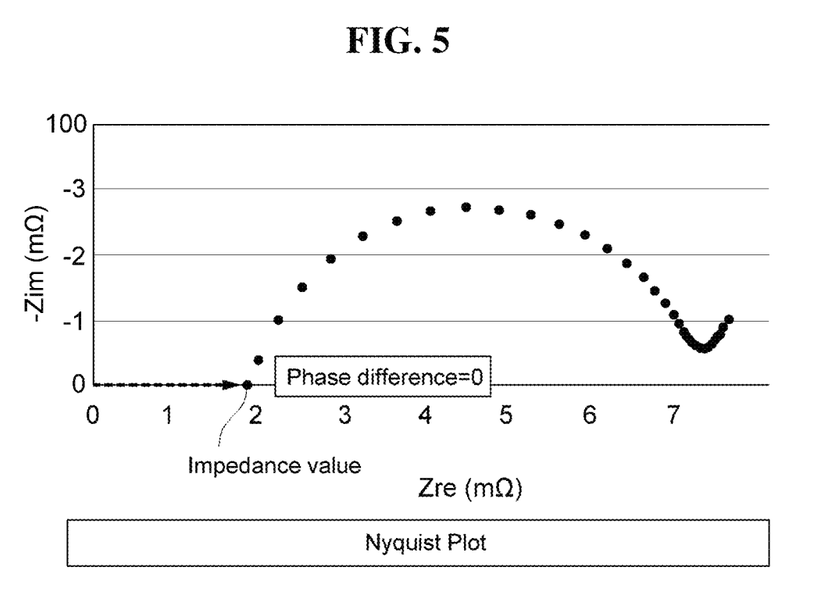

Hereinafter, the impedance identifier 150 and the AC impedance meter 230 in the system of testing electricity flow of a battery according to an embodiment of the present disclosure will be described with reference to FIGS. 3 to 5. FIG. 3 is a diagram illustrating in detail an impedance measurement configuration in a system of testing electricity flow of a battery according to an embodiment of the present disclosure, and FIGS. 4 and 5 are diagrams for explaining an impedance measuring principle in a system of testing electricity flow of a battery according to an embodiment of the present disclosure.

An electrical flow test is to test a flow of an AC current, and the flow of the AC current is affected by an AC impedance. Since a battery is an electrochemical device that uses DC electricity and the test is to determine conformance of an electricity flow thereof, a resistance to the DC electricity shows the most similar DC resistance value when there is no phase difference between current and voltage when measured through AC electricity.

In more detail, as is generally known, an impedance Z in DC electricity is calculated as "Z=resistance R", and an impedance Z in AC electricity is calculated as "Z=R (resistance)+jX (impedance)". That is, in AC electricity, dissimilar to DC electricity, the flow of AC current is affected by impedance X, and reactance X includes inductive reactance $X_L$ and capacitive reactance $X_C$.

The inductive reactance $X_L$ and the capacitive reactance $X_C$ may be expressed by Equations 1 and 2 below.

$$X_L = 2\pi f L \quad \text{[Equation 1]}$$

$$X_C = \frac{1}{2\pi f c} \quad \text{[Equation 2]}$$

In Equations 1 and 2, f is frequency, L is inductance, and C is capacitance.

Referring to Equations 1 and 2, it may be appreciated that the inductive reactance $X_L$ and the capacitive reactance $X_C$ are affected by the frequency. That is, the inductive reactance $X_L$ and the capacitive reactance $X_C$ are factors that affect the frequency of current and the frequency of voltage, generates a phase difference between the frequencies of voltage and current, and affects the cycle and change rate of the frequency of voltage and the frequency of current. These inductive reactance $X_L$ and capacitive reactance $X_C$ shift opposite to each other in terms of magnitude according to the frequency.

A phase difference ($\varphi$) between the frequency of current and the frequency of voltage may be expressed by the following Equation (3).

$$\phi = \tan^{-1}\left(\frac{\frac{1}{X_L} - \frac{1}{X_C}}{\frac{1}{R}}\right) \quad \text{[Equation 3]}$$

Accordingly, when the impedances of the inductive reactance $X_L$ and the capacitive reactance $X_C$ become equal, the phase difference between the frequency of current and the frequency of voltage becomes '0', and thus the AC impedance becomes equal to the DC impedance. A frequency when the phase difference between the frequency of current and the frequency of voltage becomes '0' in the electric circuit is called resonant frequency.

Accordingly, in the present disclosure, a resonant frequency is determined during electricity flow measurement, and an AC impedance at the resonant frequency is used as a measured AC impedance.

According to the electricity flow measurement principle of the present disclosure, the impedance identifier 150 and the AC impedance meter 230 are configured as illustrated in FIG. 3. FIG. 3 is a diagram illustrating in detail an impedance measurement configuration in a system of testing electricity flow of a battery according to an embodiment of the present disclosure.

Referring to FIG. 3, the impedance identifier 150 includes a measurement controller 151, a phase difference identifier 152, and an impedance calculator 153, and the AC impedance meter 230 includes a frequency adjustor 231, an input frequency generator 232 and an output frequency meter 233.

The measurement controller 151 operates the AC impedance meter 230 according to an instruction of the test item manager 110, and the phase difference identifier 152 receives an input frequency input to the used battery 30 and an output frequency output from the used battery 30 to identify a phase difference between the two frequencies. In such a case, the input frequency is a frequency of current, and the output frequency is a frequency of voltage.

The impedance calculator 153 identifies a point in time when a value of the phase difference continuously received from the phase difference identifier 152 is '0', and calculates the AC impedance Z by using an amplitude at the input frequency and the output frequency at the point in time when the value of the phase difference is '0', that is, the current value and the voltage value. In such a case, since the value of the phase difference of the AC impedance Z is '0', only the resistance R is calculated.

The operations of the phase difference identifier 152 and the impedance calculator 153 will be described with reference to FIGS. 4 and 5. FIGS. 4 and 5 are diagrams for explaining an impedance measurement operation in a system of testing electricity flow of a battery according to an embodiment of the present disclosure, FIG. 4 is a Bode plot illustrating a change in a phase difference of a frequency and an impedance according to a frequency change, and FIG. 5 is a Nyquist plot illustrating a real part and an imaginary part.

Referring to the Bode plot illustrated in FIG. 4(a), when the frequency varies from 0.1 by the AC impedance meter 230, a theta φ, which is a phase difference between current and voltage identified by the impedance calculator 153 varies from a negative value to a positive value as in a graph g1. In such a change, at least one resonant frequency at which the phase difference becomes '0' is determined, and the impedance calculator 153 determines a highest frequency from among the at least one resonant frequency, that is, a high-frequency resonant frequency.

As illustrated in FIG. 4(b), the impedance calculator 153 calculates an impedance at the high-frequency resonant frequency determined in FIG. 4(a) and it is considered as an AC impedance which is an electricity flow value. When the description of FIG. 4 is described through the Nyquist diagram of FIG. 5, when the frequency varies from 0.1, a section in which a value on the vertical axis, which is the imaginary part, is '0' and only a value on the horizontal axis, which is the real part, exists is displayed, and a section in which values of the imaginary part and the real part appear at the same time is displayed. In such a case, the section in which the value on the vertical axis, which is the imaginary part, is '0' and only the value on the horizontal axis, which is the real part, exists is a section in which a phase difference between voltage and current is '0', and in such a section, an impedance at a point at which the value of the real part is highest is the AC impedance calculated by the impedance calculator 153.

Figure 8:
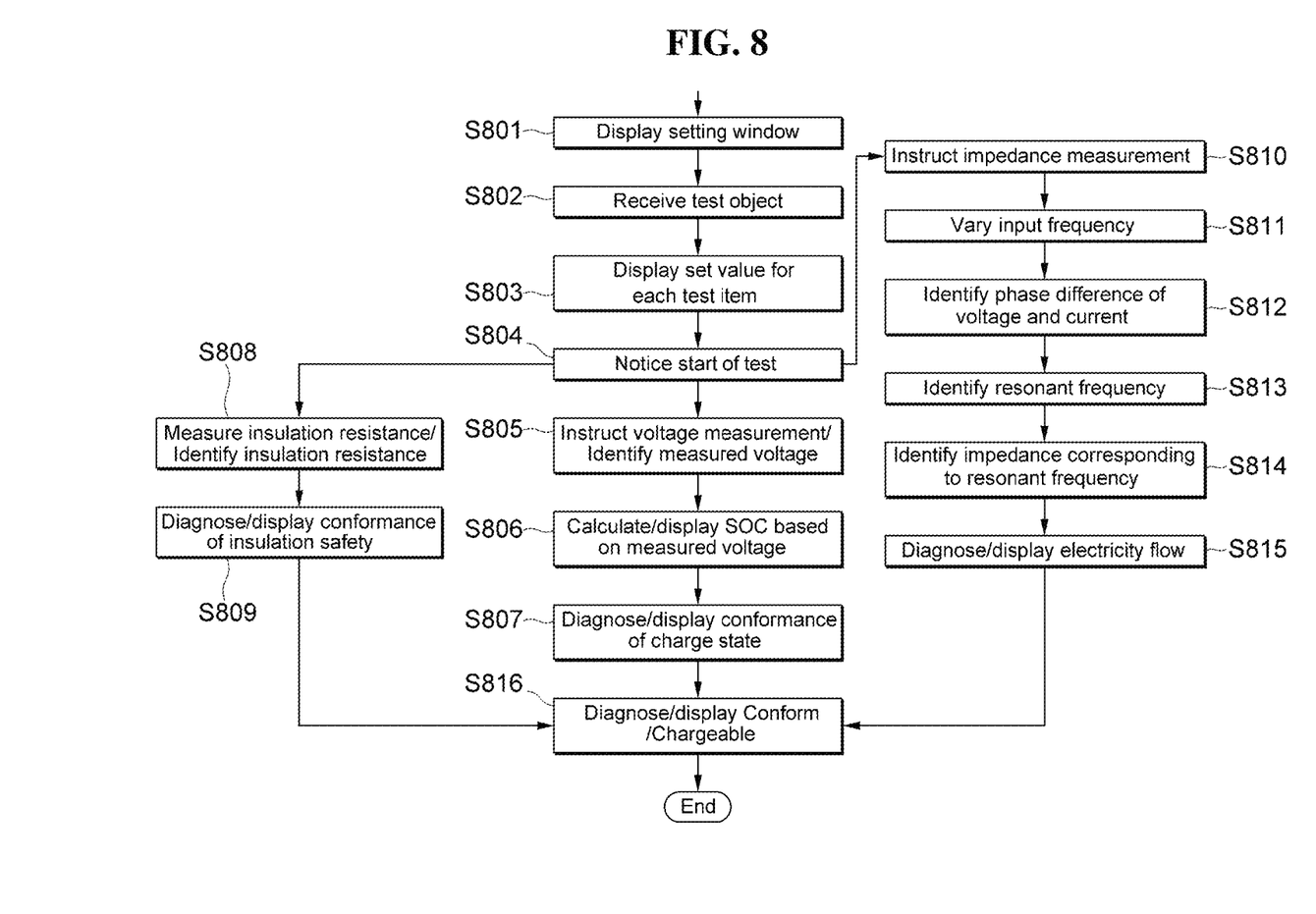
FIG. 8 is a flowchart illustrating a method of testing electricity flow of a battery according to an embodiment of the present disclosure.
Figure 9:
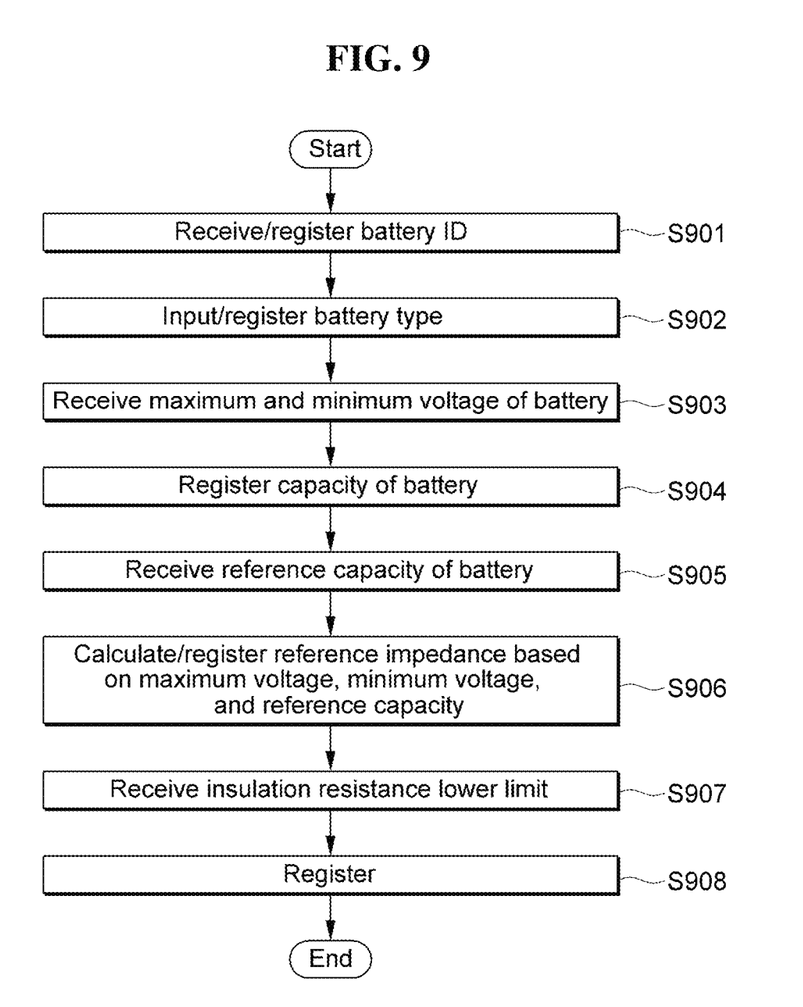
FIG. 9 is another example of a flowchart illustrating a method of testing electricity flow of a battery according to an embodiment of the present disclosure.

Hereinafter, a method of testing electricity flow of a battery according to an embodiment of the present disclosure will be described. FIG. 8 is a flowchart illustrating a method of testing electricity flow of a battery according to an embodiment of the present disclosure.

Referring to FIG. 8, the user electrically connects the battery voltage meter 210 and the insulation resistance meter 220 to the system 100 to test electricity flow of a battery, and connects terminals for tests of the battery voltage meter 210, the insulation resistance meter 220, and the AC impedance meter 230 are connected to the used battery 30.

In such a state, when the user requests a battery electricity flow test through the user input unit 10, the test item manager 110 displays an item setting screen, which is a setting window, through the display device 20 (S801).

Then, when the user selects or inputs test target information about a battery to be tested on the item setting screen through the user input unit 10, the test item manager 110 receives the test target information, for example, a battery type or battery ID (S802) and calls the set value for each test item for the received test target from the set value storage 120 and displays it on the item setting screen (S803).

Then, when the user clicks a test start button (⑥) on the item setting screen, the test item manager 110 notifies each of the identifiers 130, 140, 150 of the start of the test (S804).

Accordingly, the battery voltage identifier 130 operates the battery voltage meter 210 to measure a voltage of the used battery 30, identifies the voltage of the battery through the measured result, and provides the voltage of the battery to the voltage diagnoser 160 (S805).

The voltage diagnoser 160 calculates a state of charge (SOC) of the used battery based on the received battery voltage and provides the voltage of the battery and the calculated SOC information of the battery to the test item manager 110 to display each information on the item setting screen (S806).

In addition, the voltage diagnoser 160 diagnoses whether the received battery voltage is within a set voltage range and whether the SOC of the battery is suitable, and provides a diagnosis result to the test item manager 110 such that the diagnosis result related to the battery voltage is displayed on the item setting screen (S807).

The insulation resistance identifier 140 operates the insulation resistance meter 220 to measure an insulation resistance of the used battery 30, and identifies the insulation resistance through the measurement result to provide it to the insulation resistance diagnoser 170 (S808). The insulation resistance diagnoser 170 diagnoses whether the received insulation resistance exceeds a set insulation resistance lower limit and provides a diagnosis result to the test item manager 110 so that the insulation resistance, that is, the diagnostic result related to the insulation stability may be displayed on the item setting screen (S809).

The impedance identifier 150 operates the AC impedance meter 230 (S810), the AC impedance meter 230 then varies frequency so that the input frequency increases from 0.1 Hz to a set frequency (S811) and provides, to the impedance identifier 150, an input frequency input to the battery 30 and an output frequency corresponding to the input frequency so that the impedance identifier 150 identifies a phase difference between the input frequency and the output frequency (S812).

Then, the impedance identifier 150 determines a high-frequency resonant frequency having a phase difference of '0' (S813), identifies an AC impedance by using a voltage value and a current value of the determined high-frequency resonant frequency, and provides the identified AC impedance to the electricity flow diagnoser 180 and the test item manager 110 (S814). Accordingly, the electricity flow diagnoser 180 compares the identified AC impedance with a set electricity flow upper limit, and when the AC impedance is lower than the electricity flow upper limit, it is diagnosed as normal (e.g., pass), and when the AC impedance is higher than the electricity flow upper limit, it is diagnosed as abnormal (e.g., fail), and the diagnosis result is provided to the test item manager 110 to be displayed on the item setting screen (S815).

The diagnosis result of each diagnoser 160, 170, 180 is received by the conformance identifier 190, and the conformance identifier 190 combines each diagnosis result to diagnose that it conforms or non-conforms, and transmits the diagnosis result to the test item manager (110) to be displayed on the item setting screen (S816).

The above descriptions are intended to provide exemplary configurations and operations for implementing the inventive concept of the present disclosure. The technical spirit of the present disclosure will include not only embodiments described above, but also implementations that may be obtained by simply modifying of varying the above embodiments. In addition, the technical spirit of the present disclosure will include embodiments that may be achieved by easily modifying or varying an embodiment described above in the future.

The invention claimed is:

1. A system of testing electricity flow of a battery, the battery comprising a used battery, the system comprising:
a test item manager operating in response to an output of a user input means and configured to manage registration, modification, and deletion of a set value for each test item of one or more test items for each battery type and display of the set value, a measured value, and a diagnostic value;
a set value storage configured to match the set value for each test item registered by the test item manager with a type of the battery and store the set value;
an AC impedance meter configured to vary an input frequency, sequentially input the varied input frequency to the battery, and output an output frequency for each input frequency;
an impedance identifier configured to operate the AC impedance meter according to an instruction of the test item manager, identify a phase difference between the input frequency input to the battery and an output frequency corresponding to the input frequency to determine a high-frequency resonant frequency, and calculate an AC impedance corresponding to the determined high-frequency resonant frequency;
an electricity flow diagnoser configured to compare the AC impedance calculated by the impedance identifier with an electricity flow upper limit and diagnose as normal when the calculated AC impedance is lower than the electricity flow upper limit and diagnose as abnormal when the calculated AC impedance is higher than the electricity flow upper limit;
a battery voltage identifier configured to operate a battery voltage meter electrically connected thereto and identify a voltage of the battery through the battery voltage meter;
a voltage diagnoser configured to compare the voltage of the battery identified by the battery voltage identifier with a set voltage range and diagnose as normal when the identified battery voltage is within the set voltage range and otherwise diagnose as abnormal;
an insulation resistance identifier configured to operate an insulation resistance meter electrically connected thereto and identify an insulation resistance of the battery through the insulation resistance meter;
an insulation resistance diagnoser configured to compare the insulation resistance of the battery identified by the insulation resistance identifier with a set insulation resistance lower limit, diagnose that the insulation resistance is abnormal when the insulation resistance is lower than the set insulation resistance lower limit, and diagnose that the insulation resistance is normal when the insulation resistance is higher than the set insulation resistance lower limit; and
a conformance diagnoser configured to receive each diagnosis result output from the voltage diagnoser, the insulation resistance diagnoser, and the electricity flow diagnoser and combine each diagnosis result output to determine a final conformance result that is a final test value that is transmitted to the test item manager to be displayed on an item setting screen of the test item manager, the final test value indicating final conformance of the battery according to the diagnostic value and indicating means that the battery is in conformance or non-conformance,
wherein the impedance identifier comprises:
a measurement controller configured to operate the AC impedance meter according to an instruction of the test item manager;
a phase difference identifier configured to receive the input frequency input to the battery and an output frequency output from the battery to identify the phase difference between the input frequency and the output frequency; and
an impedance calculator configured to identify a point in time when a value of the phase difference continuously received from the phase difference identifier is '0', and to calculate the AC impedance by using an amplitude at the input frequency and the output frequency at the point in time when the value of the phase difference is '0'; and
wherein the impedance calculator is configured to identify a highest frequency corresponding to the point in time when the phase difference value is '0' as a resonant frequency of the highest frequency and calculate the impedance of a largest point corresponding to the resonant frequency of the highest frequency.

2. The system of testing electricity flow of a battery of claim 1, wherein the test item manager provides the item setting screen to a user through a display device, the item setting screen comprising a field in which a battery type, the set voltage range according to the battery type, the insulation resistance lower limit, and the electricity flow upper limit are input by a user and displayed, a field for displaying the battery voltage, the insulation resistance and the AC impedance identified by each of the identifiers, a field for displaying a state of charge, an electricity flow, and an insulation safety according to the diagnosis result of each of the diagnosers, and a field for displaying the final conformance result diagnosed by the conformance diagnoser.

3. The system of claim 2, wherein the state of charge is calculated by the system based on the voltage of the battery identified by the battery voltage identifier.

4. The system of claim 2, wherein the state of charge is identified using a state of charge table that is generated by the system based on a maximum voltage and a minimum voltage of the battery.

5. The system of claim 1 wherein each diagnosis result output is output as passing or failing, and wherein the conformance diagnoser is configured to determine that the battery conforms when all diagnosis result outputs are output as passing.

6. The system of claim 5, wherein the conformance diagnoser is configured to determine that the battery is non-conforming when at least one of the diagnosis result outputs is output as failing.

7. A method of testing electricity flow of a battery, the battery comprising a used battery, the method comprising:
setting a type of the battery to be tested and a set value for each test item of one or more test items of the type set battery;
operating an AC impedance meter according to an output of a user input means, inputting a first input frequency to the battery, and identifying a first output frequency for the first input frequency;
identifying a first phase difference between the first input frequency and the first output frequency;
determining a resonant frequency by identifying whether the first phase difference is '0';
inputting a second input frequency to the battery by varying frequency and identifying a second output frequency for the second input frequency;
sequentially varying the frequency up to a set frequency to input the varied frequency to the battery, identifying a phase difference between the input frequency input to the battery and the output frequency corresponding to the varied input frequency to determine a resonant frequency, and registering the resonant frequency;
determining a high-frequency resonant frequency as a highest resonant frequency among the registered resonant frequencies;

calculating an AC impedance using a voltage and a current at the high-frequency resonant frequency;

comparing the calculated AC impedance with an electricity flow upper limit of the set value to diagnose as normal when the calculated AC impedance is lower than the electricity flow upper limit and diagnose as abnormal when the calculated AC impedance is higher than the electricity flow upper limit;

identifying a voltage of the battery through a battery voltage meter connected thereto;

comparing the voltage of the battery with a set voltage range to diagnose that the voltage is normal when the voltage of the battery is within the set voltage range and otherwise, diagnose that the voltage is abnormal;

identifying an insulation resistance of the battery through an insulation resistance meter connected thereto;

comparing the insulation resistance identified by the insulation resistance identifier with a set insulation resistance lower limit to diagnose as abnormal when the insulation resistance is lower than the set insulation resistance lower limit and diagnosing as normal when the insulation resistance is higher than the set insulation resistance lower limit; and receiving a diagnosis result for the voltage of the battery and a diagnosis result for the insulation resistance of the battery;

determining a final conformance result based on combining the diagnosis result for the voltage and the diagnosis result for the insulation resistance, wherein the final conformance result is a final test value that indicates final conformance of the battery according to a diagnostic value and that indicates whether the battery is in conformance or non-conformance; and transmitting the final test value to a display, wherein determining and registering the resonant frequency, a phase difference identifier identifies the resonance frequency of the highest frequency at a point in time when the phase difference value is '0', and wherein calculating the AC impedance comprises using an impedance calculator to calculate the impedance of a largest point corresponding to the resonant frequency of the highest frequency.

* * * * *